(12) United States Patent
Chen et al.

(10) Patent No.: US 8,354,618 B1
(45) Date of Patent: Jan. 15, 2013

(54) LOAD CHAMBER WITH DUAL HEATERS

(75) Inventors: Jinliang Chen, Fremont, CA (US); Yew Ming Chiong, San Jose, CA (US)

(73) Assignee: WD Media, Inc., San Jose, CA (US)

( * ) Notice: Subject to any disclaimer, the term of this patent is extended or adjusted under 35 U.S.C. 154(b) by 381 days.

(21) Appl. No.: 12/828,159

(22) Filed: Jun. 30, 2010

(51) Int. Cl.
| | |
|---|---|
| *F27D 11/00* | (2006.01) |
| *H05B 3/10* | (2006.01) |
| *B05D 5/06* | (2006.01) |
| *B05D 5/12* | (2006.01) |
| *C30B 23/00* | (2006.01) |
| *C30B 25/00* | (2006.01) |
| *C30B 28/12* | (2006.01) |
| *C30B 28/14* | (2006.01) |

(52) U.S. Cl. ............ 219/385; 219/553; 427/66; 117/85
(58) Field of Classification Search .................. 219/385, 219/553; 204/192.12; 427/66; 117/85
See application file for complete search history.

(56) References Cited

U.S. PATENT DOCUMENTS

| | | | |
|---|---|---|---|
| 5,331,134 A | | 7/1994 | Kimura |
| 5,509,771 A | | 4/1996 | Hiroki |
| 5,693,199 A | * | 12/1997 | Bourez et al. ............ 204/192.12 |
| 5,925,227 A | | 7/1999 | Kobayashi et al. |
| 6,455,101 B1 | | 9/2002 | Sasaki et al. |
| 7,182,122 B2 | | 2/2007 | Koguchi et al. |
| 7,427,571 B2 | | 9/2008 | Lindeboom et al. |
| 2008/0260938 A1 | * | 10/2008 | Ikeda et al. ...................... 427/66 |
| 2009/0151634 A1 | | 6/2009 | Watanabe et al. |
| 2011/0290175 A1 | * | 12/2011 | Paranjpe et al. ................. 117/85 |

OTHER PUBLICATIONS

MDP-250B Disk Sputtering System Operator's Manual 702490C, Vacuum Systems Division, Intevac, Inc., Santa Clara, California, Apr. 9, 1996.

* cited by examiner

*Primary Examiner* — David S Blum (57) ABSTRACT

A disk processing system with a load chamber having a stationary heater and a movable heater.

21 Claims, 11 Drawing Sheets

LOAD CHAMBER WITH DUAL HEATERS

TECHNICAL FIELD

Embodiments described herein relate to the field of disk processing systems, and, in particularly, to a disk processing system having a load chamber heater with dual heaters.

BACKGROUND

Various processing systems are used in the fabrication of magnetic recording disks. One such processing system is the Intevac MDP-250B disk sputtering system, available from Intevac, Inc. of Santa Clara, Calif. The Intevac MDP-250B disk sputtering system is a production disk coating system designed to automatically sputter thin films of magnetic material and supplementary materials onto disks for magnetic information storage.

Figure 1:
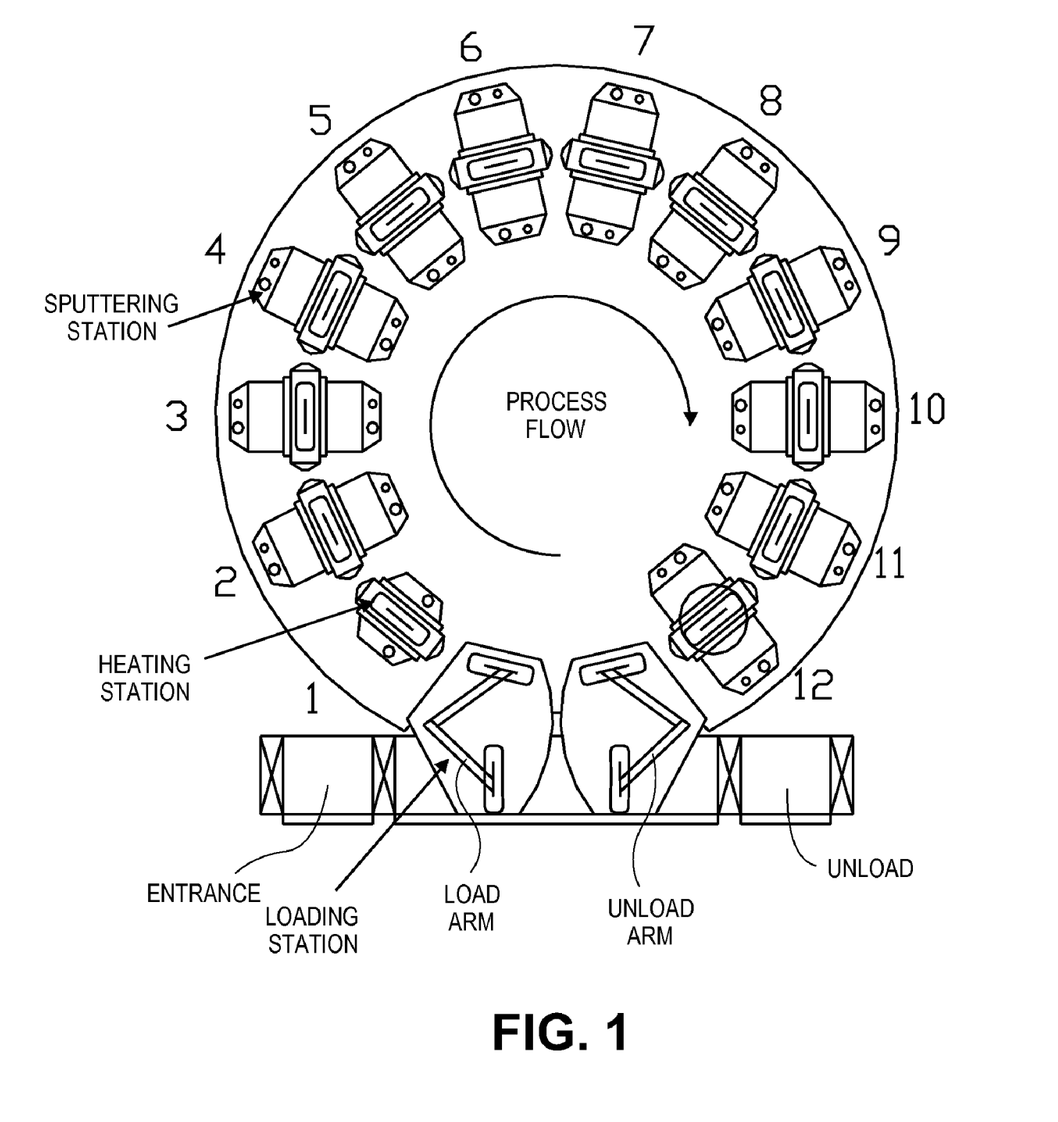
FIG. 1 illustrates a conventional Intevac MDP-250B disk sputtering system.

The Intevac MDP-250B disk sputtering system has 12 isolated process chambers, as illustrated in FIG. 1. The first process chamber is typically an infrared heater station that has quartz lamps positioned on each side of a disk. The remaining 11 process chambers are thin film deposition chambers or a combination of thin film deposition chambers and special purpose stations. The special purpose stations that may be selected are DC etch stations for cleaning disks, heating stations, and cooling stations to provide temperature control for optimum coating conditions.

BRIEF DESCRIPTION OF THE DRAWINGS

The present invention is illustrated by way of example, and not limitation, in the figures of the accompanying drawings in which.

DETAILED DESCRIPTION

Embodiments of a method are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding. In other instances, well-known manufacturing processes and equipment have not been described in particular detail to avoid unnecessarily obscuring the claimed subject matter. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment. Furthermore, the particular features, structures, materials, or characteristics may be combined in any suitable manner in one or more embodiments.

Embodiments of a disk processing system having a load chamber with a first heater mounted in the load chamber in a stationary position and a second, movable heater movably mounted in the load chamber. A movement assembly is coupled with the second heater to move the second, movable heater to an open position so as not to interfere with the positioning of the one or more disks adjacent to the first heater. The movement assembly is also configured to move the second, movable heater to a closed position being adjacent to one or more disks on an opposite side of the first heater. In one embodiment, the movement assembly may be a rotary assembly. Alternatively, the movement assembly may be configured to move the second, movable heater in other manners, for example, linear translation. In one embodiment, either or both of the first and second heaters may have a pyrolytic boron nitride heating element.

Figure 2:
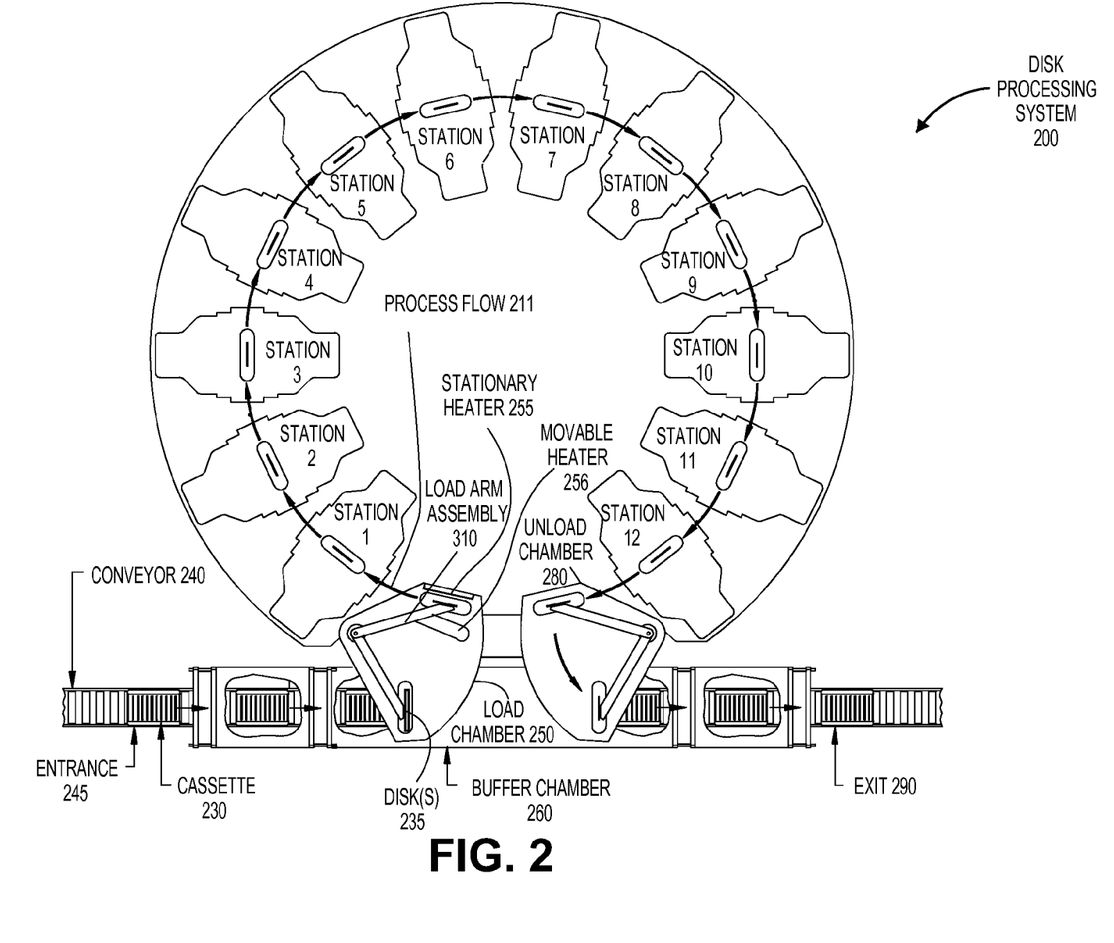
FIG. 2 illustrates a disk processing system having a load chamber heater according to one embodiment of the present invention.

FIG. 2 illustrates a disk processing system having a load chamber heater according to one embodiment of the present invention. Disk processing system 200 includes a plurality of processing chambers situated at stations 1-12 around the system, that are used to automatically coat material onto disks for magnetic information storage. Although twelve stations are illustrated in FIG. 2, the disk processing system 200 may have more or less than 12 stations in alternative embodiments. Any type of processing chamber may be mounted at any of the stations, for example, but not limited to sputter, chemical vapor deposition (CVD), etching, cooling, heating, etc. A disk transport system disposed beneath the stations transports the one or more disks 235 in a process flow 211 among the various stations, with some stations being skipped in certain embodiments. In one embodiment, the disk transport system includes a carousel having a pedestal to secure a disk. The carousel transports the one or more disks 235 among the stations. The carousel moves in at least two planes: vertically to move a disk inside and outside of a process chamber, and horizontally to position a pedestal under a process chamber. In one embodiment, the disk transport system of the Intevac MDP-250B disk sputtering system is used. Disk transport systems, such as used in the Intevac MDP-250B disk sputtering system, are known in the art; accordingly, further details are not provided herein.

A cassette 230 of unprocessed disks, for example disk(s) 235, is placed on the conveyer 240 at the entrance 245 of the system 200. The cassette 230 proceeds through several gates until it is conveyed to a buffer chamber 260. From the buffer chamber 260, disk(s) 235 from the cassette 230 are transferred into a load chamber 250 by a lift blade 353 (e.g., shown in FIG. 3B) to the load arm assembly 310 of the load chamber 250. The load arm assembly 310 takes the disk(s) 235 from lift blade 353 and swings the disk(s) 235 into position adjacent to a first heater 255 in the load chamber 250 for heating, as discussed in further detail below. Heater 255 is mounted in the load chamber 250 is to be stationary. It should be noted that while heater 255 is stationary, it may mounted in the load chamber 250 in such a manner that it can be removed and replaced (e.g., due to damage or defect).

After the disk(s) 235 are moved adjacent to stationary heater 255, a movable heater 256 is moved adjacent to disk(s) 235 on the opposite side to that of stationary heater 255. The disk(s) 235 are then heated by stationary heater 255 and movable heater 256. When the heating operation is completed, the disk(s) 235 are transferred onto a carousel pedestal for transport to a processing chamber at the first active station (e.g., station 1). Disks may be continuously loaded into the system 200, transported and processed simultaneously in all of the active processing stations. After disk(s) 235 have been rotated though all the processing stations, disk(s) 235 are moved into the unload chamber 280 for unloading into an unload cassette. The unload cassette proceeds through gates to exit 290 on the conveyer 240.

Figure 3A:
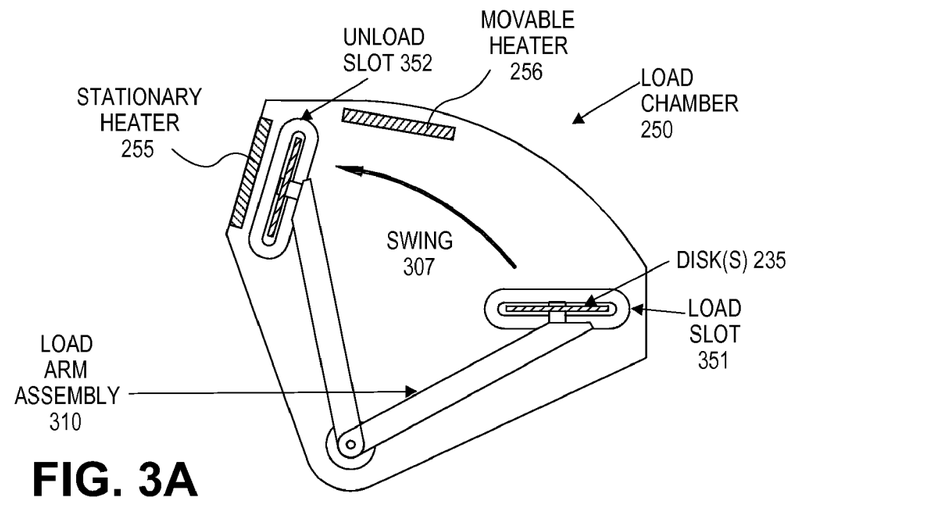
FIG. 3A is a top view, conceptually illustrating a load chamber (with a cover removed) according to one embodiment of the present invention.
Figure 3B:
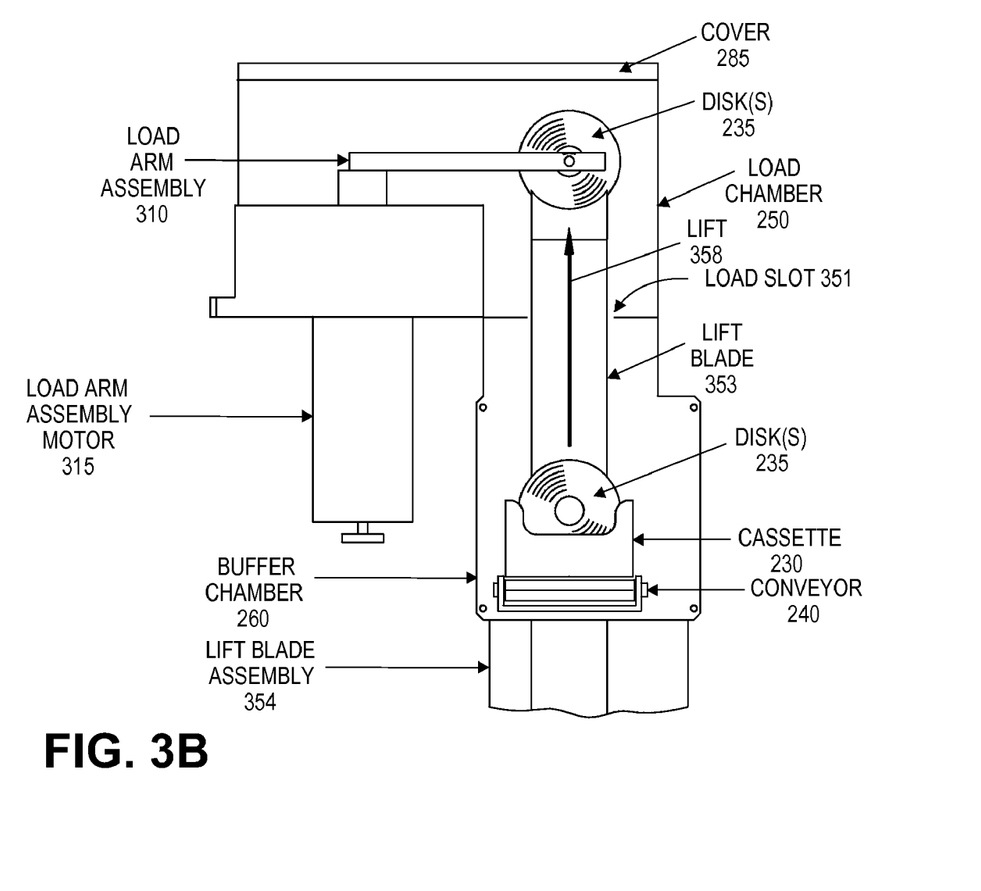
FIG. 3B is a cross sectional view of the load chamber of FIG. 3A with the load arm assembly at the disk load position.

FIG. 3A is a top view, conceptually illustrating a load chamber (with a cover removed) according to one embodiment of the present invention. FIG. 3B is a cross sectional view of the load chamber of FIG. 3A with the load arm assembly at the disk load position. After the conveyer 240 positions cassette 230 into position under the load chamber 250, a lift blade 353 of a lift blade assembly 354 lifts 358 disk(s) 235 through a load slot 351 to load the disk(s) 235 onto the lift arm assembly 310. A load arm assembly motor 315 is then used to swing 307 the load arm assembly 310 to the other side of the load chamber 250 and position disk(s) 235 adjacent heater 255, while a movable heater 256 is maintain out of the way of the load arm assembly (e.g., as shown in an open position 558 embodiment illustrated in FIG. 5A). Movable heater 256 may then be moved into position adjacent disk(s) as illustrated by the closed position 553 embodiment of FIG. 5B. The load arm assembly 310 maintains disk(s) 235 in this position while heaters 255 and 256 are active in order to heat the disk(s) 235 to a desired temperature for a desired time. After a certain amount of time, a pedestal 359 (shown in FIG. 4) rises through the unload slot 352 and transfers the disk(s) 235 to a carousel pedestal of the disk transportation system located beneath the load chamber 250. In one exemplary embodiment, the disk(s) 235 are maintained adjacent heater 255 for heating for less than 4 seconds (e.g., approximately 3.8 seconds) with a power greater than 1.1 K Watts (e.g., approximately 2.5 K Watts). Alternatively, other heating times and powers may be used. It should be noted that stationary heater 255 may not necessarily be coupled to a side wall of the load chamber 250 as conceptually illustrated in FIGS. 2 and 3A. The stationary heater 255 may be coupled within the load chamber 250 in various different manners (e.g., to a cover of the load chamber), as discussed in more detail below.

Figure 4:
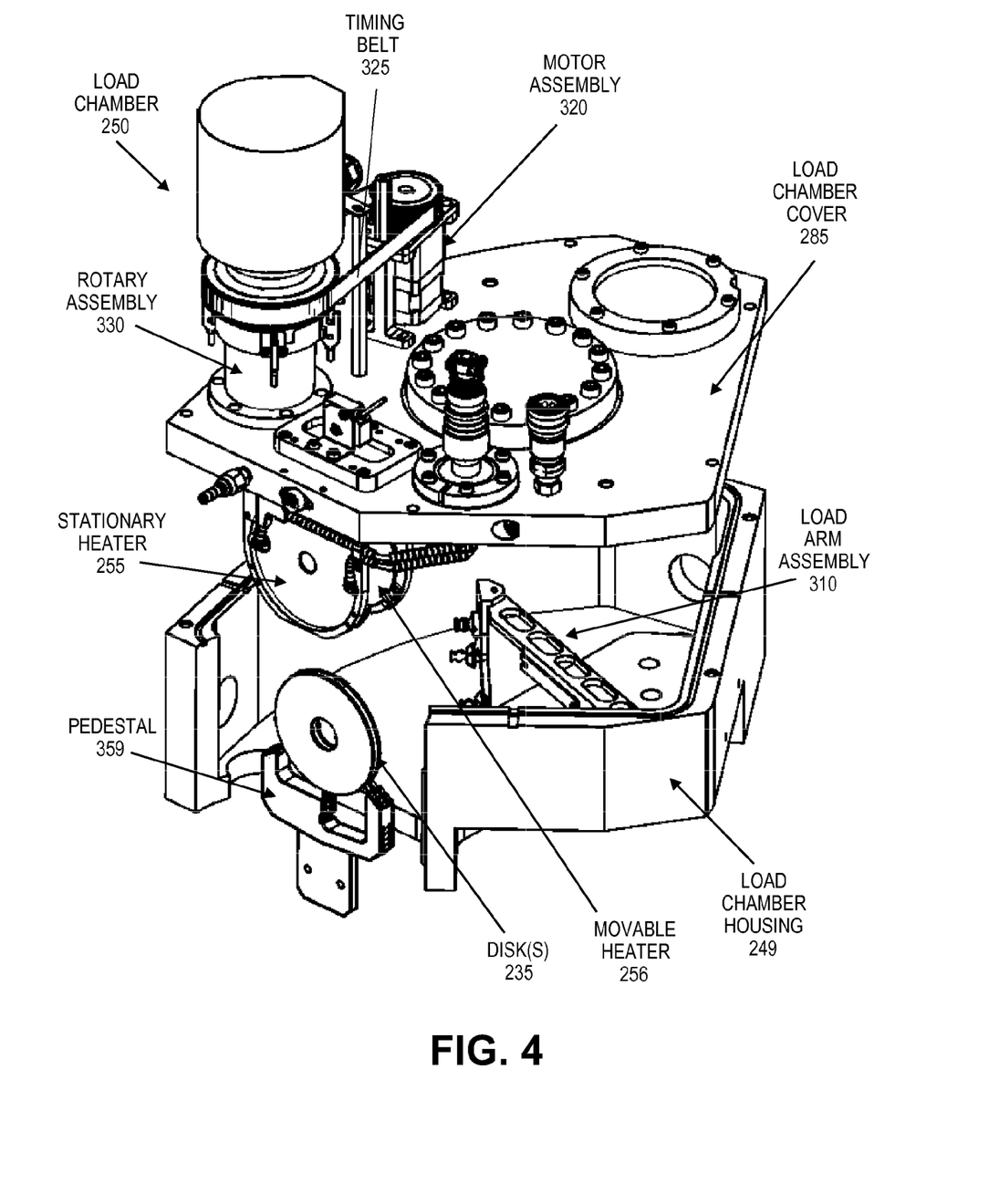
FIG. 4 is an perspective view providing a more detailed illustration of a load chamber having dual heaters, according to one embodiment of the present invention.

FIG. 4 is an exploded, perspective view illustrating a load chamber according to one embodiment of the present invention. The load chamber 250 includes a load chamber housing 249 and a load chamber cover 285. A load arm assembly is disposed within the load chamber 250. In this embodiment, the movement assembly is a rotary assembly 330. A motor assembly 320 is operative coupled to drive the rotary assembly 330 with timing belt 325. The motor assembly 320 and a rotary assembly 330 are mounted to the load chamber cover 285. The rotary assembly 330 is operative coupled with the movable heater 256 to move the heater 256 into the closed position 553 illustrated in FIG. 5B and out of the position adjacent to disk(s) 235 to an open position such as the open position 558 illustrated in FIG. 5A. As discussed in further detail below, the movable heater 256 may be situated in other open positions in alternative embodiments.

Figure 5A:
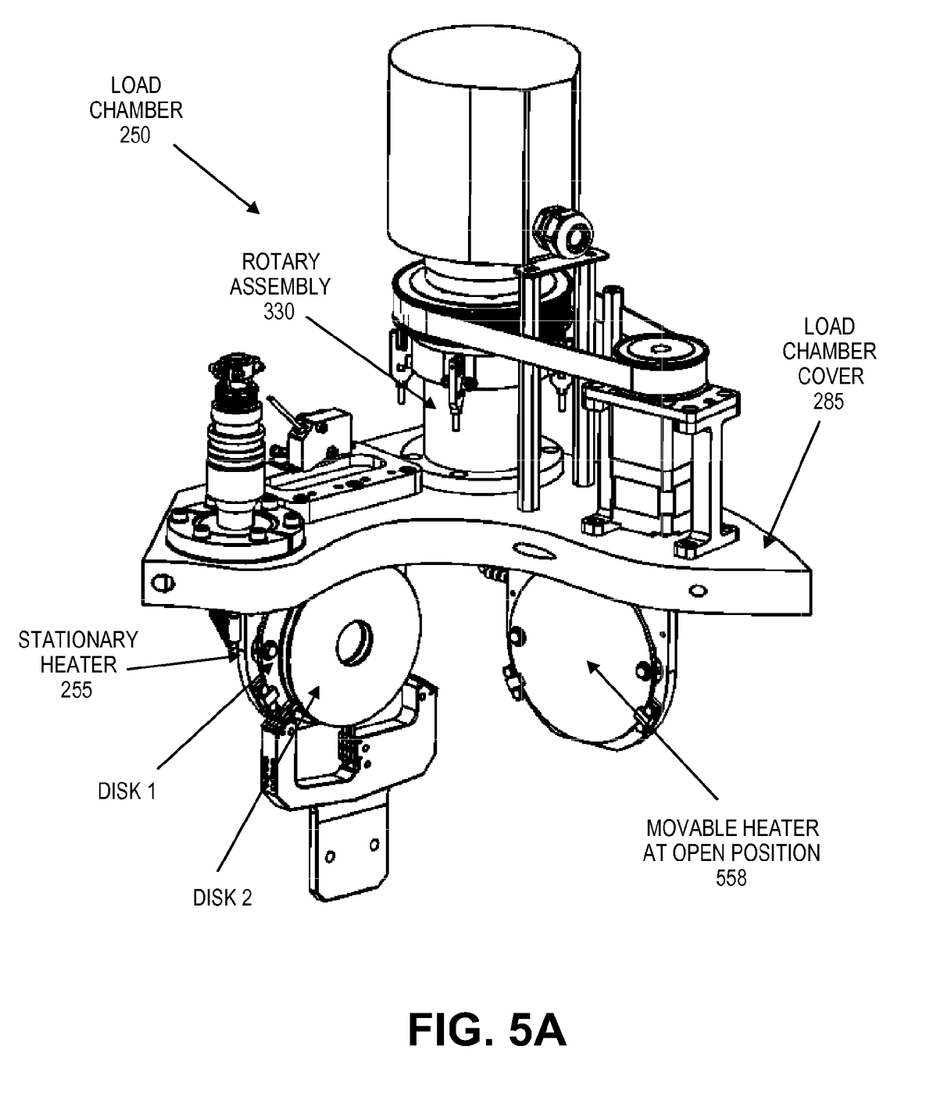
FIG. 5A is a perspective view illustrating a movable heater in load chamber at an open position according to one embodiment of the present invention.
Figure 5B:
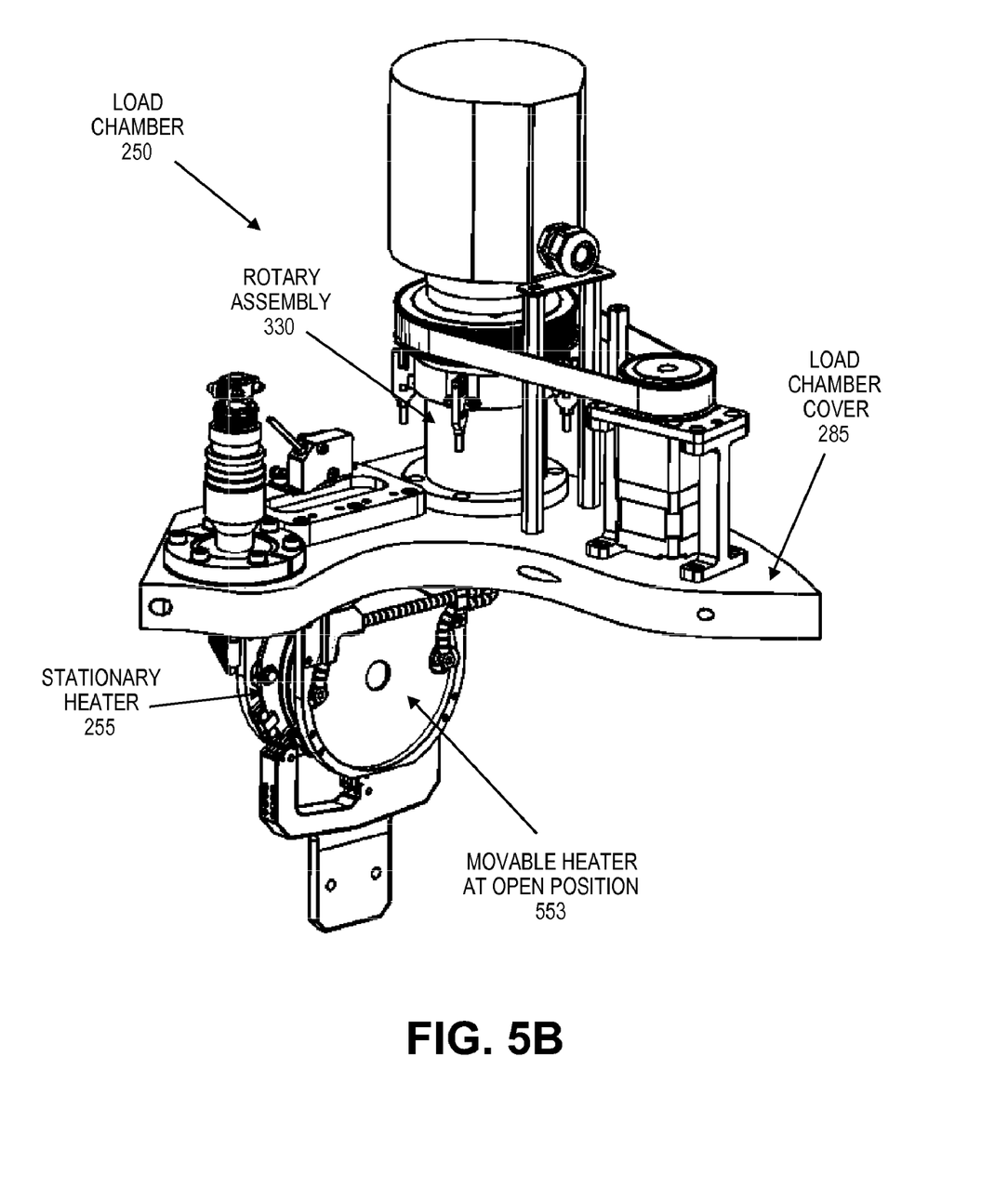
FIG. 5B is a perspective view illustrating one embodiment of a movable heater in load chamber at an closed position.

The movable heater 256 is moved away from its position illustrated in FIG. 4 to an open position such as shown in FIG. 5A before the load arm assembly 310 swings the disk(s) 235 into the position adjacent stationary heater 255. The movable heater 256 is then moved to a closed position 553 as shown in FIG. 5B to be adjacent to the disk(s) 235 on the side opposite of stationary heater 255. After heating of disk(s) 235, pedestal 359 rises through the unload slot 352 to remove the disk(s) 235 from the load chamber.

Figure 6:
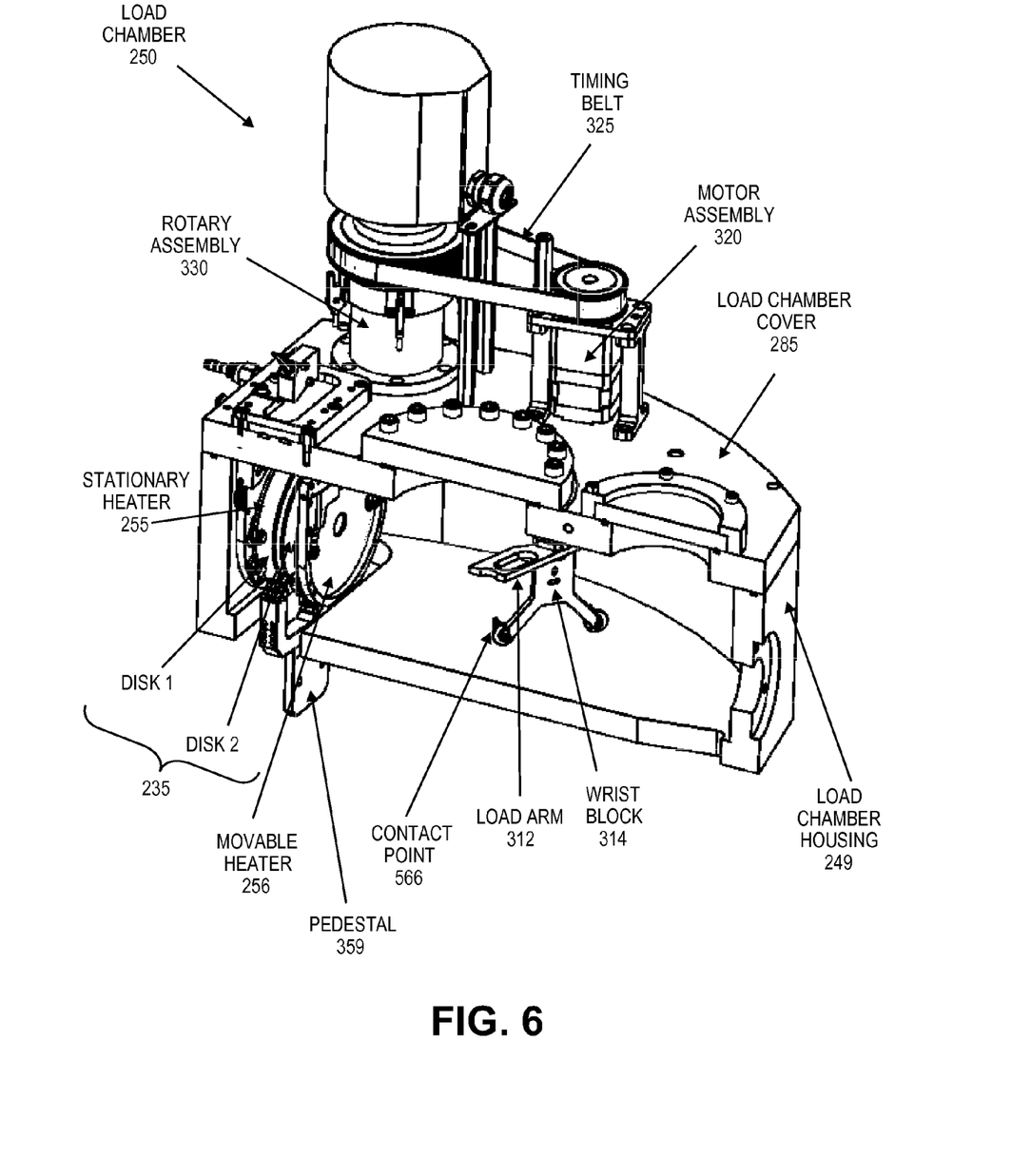
FIG. 6 is a cross section view of a load chamber having a stationary heater and movable heater, according to one embodiment of the present invention.

FIG. 6 is a cross section view of a load chamber having a stationary heater and movable heater, according to one embodiment of the present invention. In FIG. 6, the load chamber 250 is shown with cover 285 mounted to the top of the load chamber housing 249. The load arm assembly 310 is shown after the movable heater 256 has been positioned adjacent to disk(s) 235 and with the pedestal 359 securing disk(s) 235. The heater 255 is situated in the load chamber 250 in the space between the unload slot 352 and the side wall 251 of the load chamber 250. Movable heater 256 is situated on the side of disk(s) 235 opposite to that of heater 255. The heating element of each of heaters 255 and 256 may be approximately sized (e.g. diameter) to cover the surface of the disk(s) 235 but, alternatively, may be sized smaller or larger than the disk(s) to be heated. In this embodiment, the heater 255 is mounted within a bracket 456 that is coupled to load chamber cover 285. It should be noted that although the figures illustrated two disks (i.e., disk 1 and disk 2), in an alternative embodiment disk(s) 235 may represent a single double sided disk.

In the embodiment illustrated in FIG. 6, the load arm assembly 310 is composed of a load arm 312 coupled to a wrist block 314. The wrist block 314 has a plurality of disk contact points (e.g., contact point 566) to secure a disk 1 and disk 2 when loaded thereon. In one embodiment, the load arm 312 and wrist block 314 may be constructed from a nickel steel alloy, such as, for example, Invar™ (also known generically as 64FeNi and FeNi). Invar has a lower temperature coefficient of expansion and thus may be more thermally stable than other materials. In alternative embodiments, the load arm 312 and wrist block 314 and contact points may be constructed from other high temperature resistant materials such as, for example, Molybdenum, titanium, aluminum, ceramic and stainless steel. In one embodiment, the contact points are constructed from ceramic.

Figure 7A:
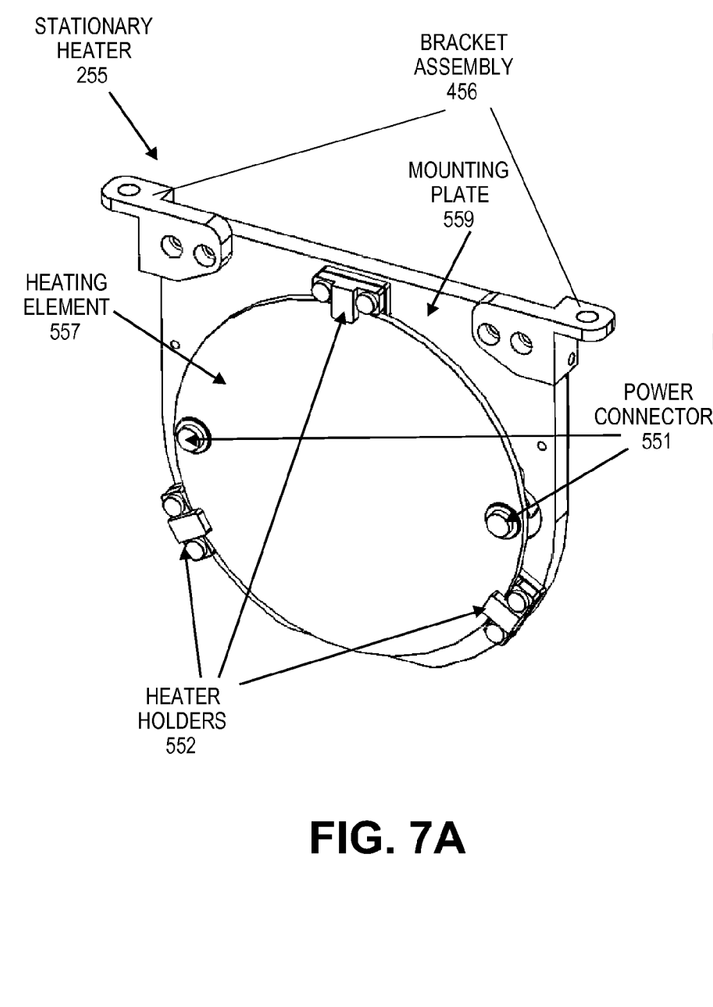
FIG. 7A illustrates a stationary heater according to one embodiment of the present invention.

FIG. 7A illustrates a stationary heater according to one embodiment of the present invention. In this embodiment, heater 255 includes a bracket assembly 456 configured to be mounted (e.g., with bolts, nuts, screws, etc.) to cover 285 of the load chamber 250. In alternative embodiments, the bracket assembly 456 may be mounted to other sections of the load chamber 250, for example, a side wall of the load chamber housing 249. The bracket assembly 456 is constructed from a high heat resistant material such as those discussed above. In the embodiment illustrated in FIG. 7A, the heating element 557 is secured to the mounting plate 559 with three holders 552. Electrical connection is made to the heating element 557 with power connectors 551. In one embodiment, the heating element 557 is a pyrolytic boron nitride heating element. Alternative, the heater 255 may have other types of heating elements, for example, an infrared heating element.

Figure 7B:
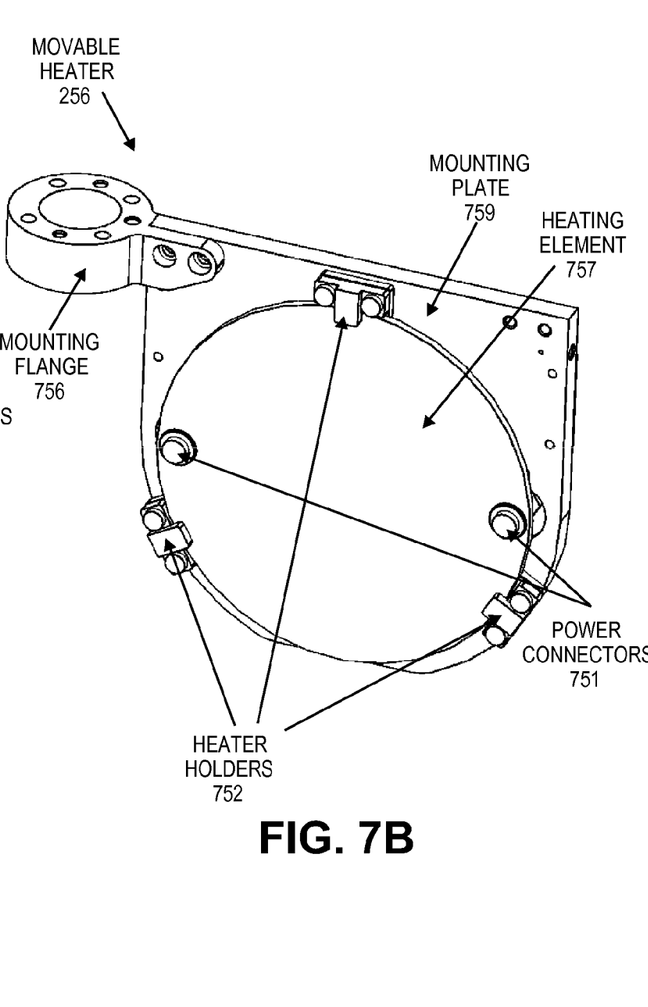
FIG. 7B illustrates a movable heater according to one embodiment of the present invention.

FIG. 7B illustrates a movable heater according to one embodiment of the present invention. In the embodiment illustrated in FIG. 7B, movable heater 256 includes a heating element 757 that is secured to the mounting plate 759 with three holders 752. Electrical connection is made to the heating element 757 with power connectors 751. In one embodiment, the heating element 757 is a pyrolytic boron nitride heating element. Alternative, the heater 256 may have other types of heating elements, for example, an infrared heating element.

In one embodiment, movable heater 256 includes a mounting flange 756 that is mounted (e.g., with bolts, nuts, screws, etc.) to mounting plate 759. In one embodiment, the mounting flange is configured to be coupled to a shaft to rotate the mounting plate 759, and thereby heating element 757, about a rotational axis coincident with the length of the shaft as is discussed in relation FIG. 8. In alternative embodiments, the mounting plate 759 may be coupled to a movable mechanism in other manners.

Figure 8:
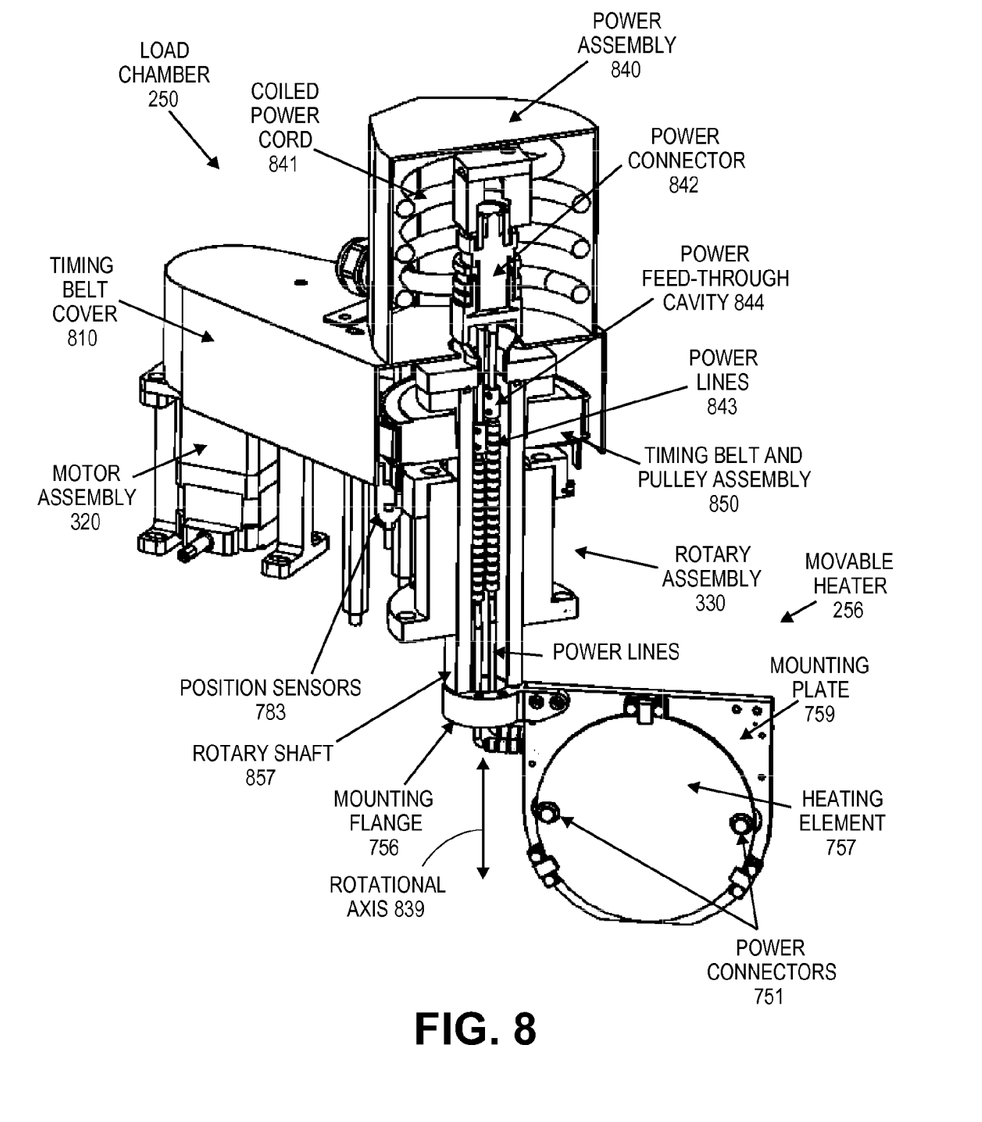
FIG. 8 provides perspective and cross section views of components of a load chamber, according to one embodiment of the present invention.

FIG. 8 provides perspective and cross section views of components of a load chamber, according to one embodiment of the present invention. In the view of FIG. 8, a timing belt cover 810 partially obscures the timing belt 325 that operative couples together the motor assembly 320 to drive the rotary assembly 330. The timing belt 325 can be more readily seen, for example, in reference to FIGS. 4 and 6. In one embodiment, a power assembly 840 is mounted on top of the rotary assembly 330. The power assembly 840 includes a coiled power cord 841 and a power connector 842. The power connector 842 is coupled to the power connectors 751 of the movable heater 256 with power lines 843 that are routed through the inside of rotary shaft 857 in power feed-through cavity 844 in order to provide power to the heating element 757.

The mounting flange 756 is coupled to rotary shaft 857 of the rotary assembly 330 which, in turn, is coupled to a timing belt and pulley assembly 850 that turns rotary shaft 857 when driven by motor assembly 320. The rotation of rotary shaft 857, in turn, rotates the movable heater 256, about rotational axis 839 coincident with the length of the shaft, between the open and closed positions illustrated in FIGS. 5A and 5B, respectively.

In one embodiment, one or more position sensors 783 are operatively coupled to rotary assembly in order to detect when the movable heater 256 is in the open and closed positions of FIGS. 5A and 5B. In one embodiment, motor assembly 320 is a stepper motor. Alternatively, motor assembly 320 may be other types of motors. In alternative embodiments, mechanisms other than a timing belt and pulley assembly may be used to turn the rotary shaft 857. The construct and operation of motor assemblies, timing belt and pulley assemblies and rotary assemblies are known in the art; accordingly, further description of such is not provided herein.

Figure 9:
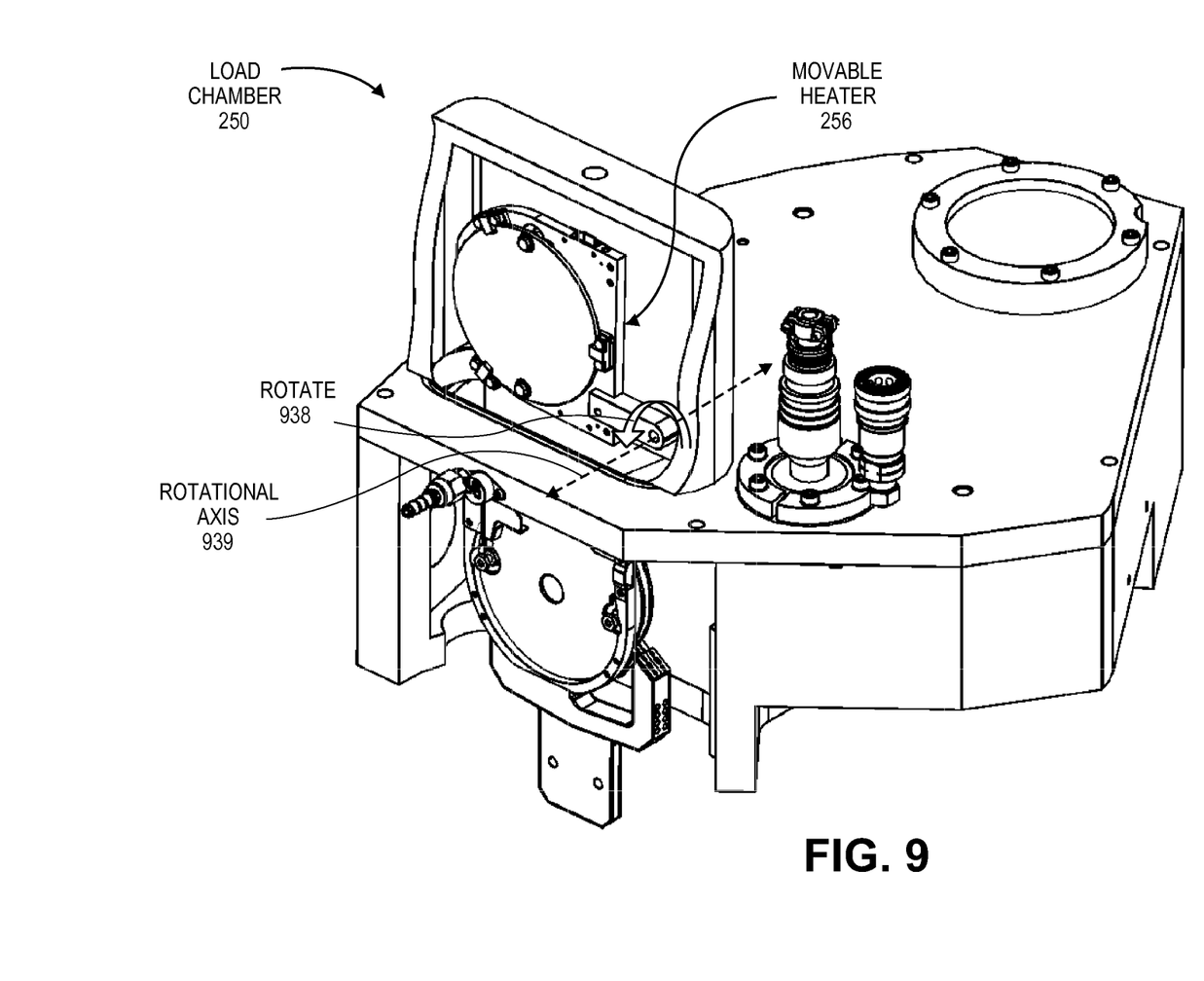
FIG. 9 is a perspective view illustrating an alternative embodiment of a rotatably movable heater.

It should be noted that the movable heater 256 may be moved by a movement assembly in other rotational axis and directions and also other non-rotational manners. In one alternative embodiment, for example, the movable heater 256 may be configured to rotate 938 about rotational axis 939 as illustrated in FIG. 9. Rotational axis 939 in the embodiment illustrated in FIG. 9 is perpendicular to the rotational axis 839 of the embodiment illustrated in FIG. 8. The movable heater 256 of FIG. 8 may be rotated using rotary and motor assemblies similar to those discussed above.

Figure 10:
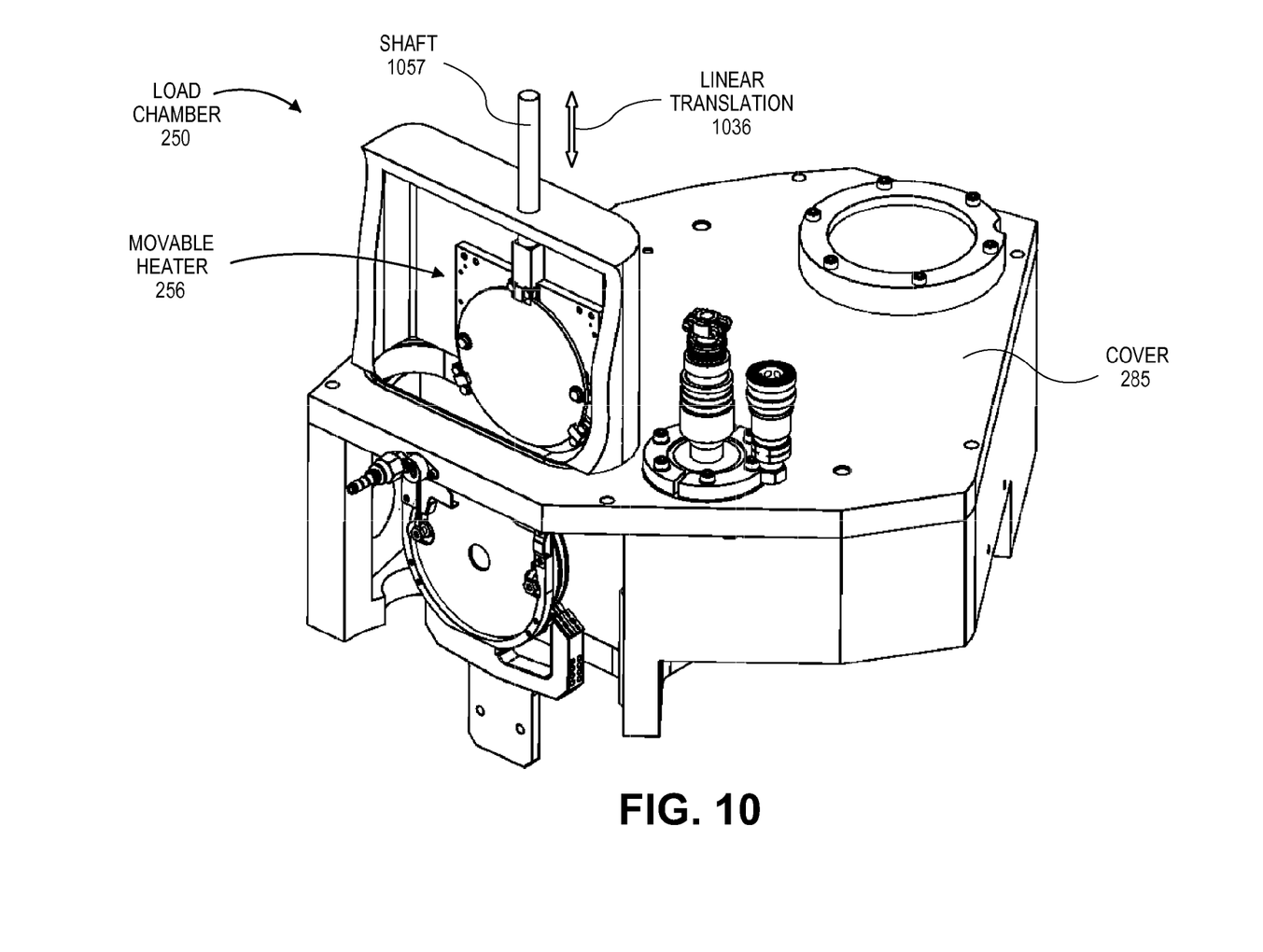
FIG. 10 is a perspective view illustrating a linearly movable heater according to one embodiment of the present invention.

In another embodiment, for example, the movable heater 256 may be configured to linearly translate 1036 (e.g., vertically) into and out of a closed position through a slot in the load chamber cover 285 as illustrated in FIG. 10. The movable heater 256 of FIG. 10 may be translated using a translation assembly, for example, coupled to shaft 1057 and driven by a motor assembly. In yet another embodiment, the movable heater 256 may be linearly translated horizontally into and out of the closed position through a slot in the load housing chamber 249. The various types of assemblies that could be used to move the movable heaters of FIGS. 9 and 10 are known in the art; accordingly, a more detailed discussion is not provided herein.

In the foregoing specification, the present invention has been described with reference to specific exemplary embodiments thereof. It will, however, be evident that various modifications and changes may be made thereto without departing from the broader scope of the embodiments of the invention as set for in the appended claims. For example, although steps of embodiments of inventive methods may have been described in a specific order, one of skill in the art will understand that some of the steps described may occur simultaneously, in overlapping time frames, and/or in a different order from that described and claimed herein and fall within embodiments of the present invention. The specification and drawings are, accordingly, to be regarded in an illustrative rather than a restrictive sense.

What is claimed is:

1. A disk processing system, comprising:
   a load chamber comprising:
      a first heater non-movably mounted in the load chamber in a stationary position;
      a second heater; and
      a movement assembly coupled to the second heater to move the second heater.

2. The system of claim 1, wherein the movement assembly comprises a rotary assembly coupled with the second heater to move the second heater about a rotational axis.

3. The system of claim 1, wherein the movement assembly comprises a linear assembly coupled with the second heater to linearly translate the second heater.

4. The system of claim 1, wherein the load chamber further comprises a load arm assembly comprising:
   a load arm;
   a wrist block coupled to the load arm; and
   plurality of disk contact points coupled to the wrist block.

5. The system of claim 2, further comprising:
   a load chamber cover; and
   a motor assembly operatively coupled to the rotary assembly using a timing belt and pulley assembly, wherein the motor and the rotary assemblies are mounted to the load chamber cover.

6. The system of claim 5, wherein the motor assembly comprises a stepper motor.

7. The system of claim 2, wherein the rotary assembly further comprises:
   a rotary shaft coupled to a timing belt and pulley assembly;
   a mounting flange coupled to the rotary shaft; and
   a mounting plate coupled to the mounting flange.

8. The system of claim 7, wherein the second heater is coupled to the mounting plate using one or more holders, and wherein the mounting plate and the one or more holders are constructed from a material either comprising molybdenum or tantalum.

9. The system of claim 7, further comprising:
   a power assembly;
   one or more power connectors coupled to the second heater and the mounting plate; and one or more power lines disposed within the power feed through cavity in the rotary shaft coupling the power assembly to the one or more power connectors on the mounting plate.

10. The system of claim 1, wherein the second heater comprises a pyrolytic boron nitride heating element.

11. The system of claim 1, wherein positions of the first and second heaters within the load chamber are configured to heat one or more disks.

12. The disk processing system of claim 1, wherein the first heater is non-movably mounted in the load chamber in a manner permitting removal and replacement due to damage or defect.

13. A method of operating a load chamber, comprising:
moving, in the load chamber, a load arm assembly securing one or more disks to a position adjacent to a first heater on a first side of the one or more disks, wherein the first heater is non-movably mounted in the load chamber in a stationary position;
moving, in the load chamber, a second heater adjacent to the one or more disks on a second side of the one or more disks opposite that of the first heater; and
heating, in the load chamber, the one or more disks with the first and second heaters.

14. The method of claim 13, wherein moving the second heater comprises rotating a mounting plate, to which the second heater is coupled, about a rotational axis.

15. The method of claim 14, wherein the mounting plate is coupled to a rotary shaft, and wherein the second heater is rotated by rotation of the rotary shaft using a timing belt and pulley assembly.

16. The method of claim 15, further comprising powering the second heater using power lines disposed in a power feed through cavity of the rotary shaft and coupled to power connectors disposed on the second heater.

17. The method of claim 13, wherein the one or more disks comprise two, single sided disks.

18. The method of claim 17, further comprising:
loading the two, single sided disks into the load chamber prior to moving the load arm assembly; and
moving the second heater away from the two, single sided disks after heating; and
unloading the two, single sided disks out of the load chamber.

19. The method of claim 13, wherein the first heater is non-movably mounted in the load chamber in a manner permitting removal and replacement due to damage or defect.

20. A disk processing system, comprising:
means for moving, in a load chamber, a load arm assembly securing one or more disks to a position adjacent to a first heater on a first side of the one or more disks, wherein the first heater is non-movably mounted in the load chamber in a stationary position;
means for moving a second heater adjacent to the one or more disk on a second side of the one or more disks opposite that of the first heater; and
means for heating the one or more disks with the first and second heaters.

21. The disk processing system of claim 20, wherein the first heater is non-movably mounted in the load chamber in a manner permitting removal and replacement due to damage or defect.

* * * * *